United States Patent [19]

Hasegawa et al.

[11] 3,890,150

[45] June 17, 1975

[54] PHOTOSENSITIVE COMPOSITIONS INCLUDING AROMATIC BIS-ACRYLIC DERIVATIVES

[75] Inventors: Masaki Hasegawa, Tokyo; Fusae Nakanishi, Yokohama; Hachiro Nakanishi, Yokohama; Shoji Watanabe, Yokohama; Yasuzo Suzuki, Yokohama; Hisashi Nakane, Kawasaki; Toshimi Aoyama; Yukio Komatsubara, both of Tokyo; Setsuo Nojima, Kawasaki; Hiroshi Tagami, Yokohama, all of Japan

[73] Assignees: Director-General, Agency of Industrial Science & Technology Co. Ltd., Tokyo; Tokyo Ohka Kogyo Co., Ltd., Kanagawa, both of Japan

[22] Filed: Sept. 19, 1973

[21] Appl. No.: 398,825

Related U.S. Application Data

[63] Continuation of Ser. No. 149,771, June 3, 1971, abandoned.

[30] Foreign Application Priority Data

June 3, 1970 Japan .............................. 45-48345
June 3, 1970 Japan .............................. 45-48346

[52] U.S. Cl. ...................... 96/33; 96/35.1; 96/36.3; 96/86 P; 96/115 P; 96/115 R; 204/159.16

[51] Int. Cl. ............................................ G03c 1/70

[58] Field of Search ............ 96/115 R, 115 P, 35.1, 96/33; 204/159.16

[56] References Cited

UNITED STATES PATENTS

| | | | |
|---|---|---|---|
| 2,965,553 | 12/1960 | Dixon et al. | 204/159.17 |
| 3,486,903 | 12/1969 | Henkler et al. | 96/115 R |
| 3,615,629 | 10/1971 | Wilhelm et al. | 96/115 R |

*Primary Examiner*—Ronald H. Smith
*Attorney, Agent, or Firm*—William J. Daniel

[57] ABSTRACT

Aromatic bis-acrylic derivatives of the formula:

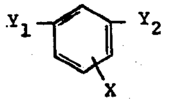

wherein $Y_1$ and $Y_2$ each represent a $$CH_2=\underset{R}{C}-\underset{O}{\overset{}{C}}-O- \text{ or } CH_2=\underset{R}{C}-\underset{O}{C}-NH-$$

group, and R and X are each a hydrogen atom or a lower alkyl group; a process for their preparation, and photosensitive ccompositions comprising such derivatives in admixture with linear polyamides in molar ratios of 2:1–1:100.

5 Claims, No Drawings

PHOTOSENSITIVE COMPOSITIONS INCLUDING AROMATIC BIS-ACRYLIC DERIVATIVES

This is a continuation of Ser. No. 149,771, filed June 3, 1971, now abandoned.

BACKGROUND OF THE INVENTION

1. Field of the Invention

This invention relates to new aromatic bis-acrylic derivatives and a process for producing the same. This invention relates also to a highly photosensitive composition comprising a mixture of said compound and a linear polyamide and to a planographic printing plate carrying a relief image obtained therefrom.

2. Description of the Prior Art

Photosensitive resinous or polymeric compositions comprising a mixture of a linear polyamide and one of a certain class of ethylenically unsaturated organic compound are already known. In such compositions, the unsaturated organic compound functions as a bridging or coupling agent for the linear polyamide. More specifically, ethylenically unsaturated organic compounds heretofore used for this purpose include diacrylates or dimethacrylates of such an ethylene glycol, diethylene glycol, triethylene glycol and the like; polyacrylates or polymethacrylates of polyhydroxy compounds such as glycerol, pentaerylthritol, cane sugar, sorbitol and so on; and their amino analogues, such as N,N'-methylene-bisacrylamide and N,N'-hexamethylene-bis-acrylamide, among others. However, ethylenically unsaturated organic compounds of these types have only limited compatibility with linear polyamides and are difficult to incorporate in reasonably large amounts into admixture with the polyamide.

Generally speaking, sensitivity of the photosensitive resin composition tends to increase with increasing proportions of the unsaturated organic compound present in the mixture as the bridging or coupling agent. Thus, a key problem in the field of this art has been the discovery of ethylenically unsaturated organic compounds having good compatibility with linear polyamides.

In recent years, a process was proposed (Japanese Patent Publication No. 7330/70) for the production of a planographic printing plate carrying a resinous relief image wherein a linear polyamide composition having a relatively large amount of m- or p-xylene bis-acrylamide or bis-methacrylate incorporated therewith as a coupling agent was used as the starting material for the relief image. However, a limitation as to the permissible proportion of the coupling agent likewise applies to this process and large amounts of the coupling agent can be incorporated into the linear polyamide composition only in combination with other unsaturated organic compounds or jointly with some auxiliary additive. Thus, the proposed process has not been found satisfactory from a practical point of view.

As the result of much research directed to the development of coupling compounds possessing excellent compatibility with linear polyamides, a specific class of aromatic bis-acrylic derivatives have unexpectedly been found to meet this requirement.

OBJECTS OF THE INVENTION

It is an object of this invention to provide a new class of ethylenically unsaturated compounds possessing excellent compatibility with linear polyamides.

Another object of this invention is a useful process for the production of this class of unsaturated compounds.

A further object of this invention is a highly photosensitive composition obtained by mixing one of said unsaturated compounds with a linear polyamide.

It is still another object of this invention to provide a planographic relief printing plate manufactured from this photosensitive composition.

Still further objects will become apparent as the following description proceeds.

GENERAL DESCRIPTION OF THE INVENTION

In accordance with one aspect of this invention, there is provided a group of aromatic bis-acrylic derivatives of the general formula:

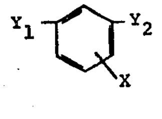

(I)

wherein $Y_1$ and $Y_2$ each represent $CH_2{=}C(R){-}C({=}O){-}O{-}$ or $CH_2{=}C(R){-}C({=}O){-}NH{-}$ group, R is a hydrogen atom or a lower alkyl group, and X is a hydrogen atom or a lower alkyl group.

In general formula I, $Y_1$ and $Y_2$ may be same or different; thus, both of $Y_1$ and $Y_2$ can be a $CH_2{=}C(R){-}C({=}O){-}O{-}$ group or a $CH_2{=}C(R){-}C({=}O){-}NH{-}$ group, or alternatively, either of $Y_1$ and $Y_2$ can be a $CH_2{=}C(R){-}C({=}O){-}O{-}$ group and the other a $CH_2{=}C(R){-}C({=}O){-}NH{-}$ group.

In a preferred embodiment of this invention, each of R and X is a hydrogen atom or methyl group. Ideally, both R and X are hydrogen atoms.

As typical examples of the aromatic bis-acrylic derivatives of the above general formula, there can mentioned, for example, 1,3-bis-acryloyloxybenzene (resorcinol bis-acrylate), 1,3-bis-methacryloyloxybenzene (resorcinol bis-methacrylate), N,N'-bis-acryloyl-m-phenylenediamine, N,N'-dimethacryloyl-m-phenylenediamine, 1-acryloyloxy-3-acryloylaminobenzene (N-acryloyl-m-aminophenol acrylate), etc.

According to this invention, the unsaturated compounds of the above general formula I are prepared by reacting an aromatic compound of the general formula:

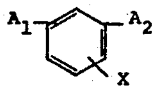
(II)

wherein $A_1$ and $A_2$ each represent a hydroxyl or primary amino group and X has the meaning given above, with an acryloyl or alpha-alkylacryloyl halide of the general formula:

$$CH_2=\underset{R}{C}-\underset{O}{\overset{}{C}}-\text{ halogen} \quad (III)$$

wherein R has the meaning given above, in appropriate molar proportions preferably about 1:2.

In the general formula II, $A_1$ and $A_2$ are selected according to the desired end product and may be same or different; both can be HO— or $NH_2$—, or alternatively, one can be Ho— and the other $NH_2$—. Typical examples of starting materials represented by the general formula II include M-phenylenediamine m-aminophenol and resorcinol. These compounds may carry in their benzene nucleus a lower alkyl group such as methyl group. Here and elsewhere in this description, "lower alkyl" encompasses alkyl groups having up to about 7 carbon atoms and more preferably up to about 4 or 5 carbon atoms.

As examples of acryloyl and alpha-acryloyl halides represented by the general formula III, there can be mentioned acryloyl chloride, acryloyl bromide, methacryloyl chloride and alpha-ethyl-acryloyl bromide, among others, and acryloyl chloride and methacryloyl chloride and especially preferable.

The process is preferably carried out by reacting a compound of the general formula II in a solvent with an acryloyl or alpha-alkylacryloyl halide of the general formula III in the presence of a basic condensation catalyst. In this case, the molar proportion of the compound of the general formula II and the compound of the general formula III is desirably adjusted closely to about 1:2, although either one may be used in excess if preferred. No particular requirements are necessary for the solvents usable for the reaction, provided they are inert to each reactant. Preferred solvents are aromatic hydrocarbons, such as benzene, toluene, xylene, etc.; halogenated hydrocarbons, such as chloroform, carbon tetrachloride, methylene chloride, trichloroethylene, terachloroethylene, chlorobenzene, etc., ketones such as acetone, methyl ethyl ketone, etc.; ethers such as dioxane, ethyl ether, etc.; and water.

Utilizable as the basic condensation catalyst are inorganic bases, such as caustic soda, caustic potash, sodium carbonate, sodium bicarbonate, potassium carbonate and ammonia, or organic bases, such as triethylamine and pyridine.

The reaction temperature is suitably selected from the range of from −20° to +50°C. The reaction in this invention proceeds smoothly within this range and is usually complete within a period from several ten minutes to several hours with a high yield of end product. For example, the reaction between resorcinol and acryloyl chloride in an aqueous solution of caustic soda reaches completion in about 1 hour to give the end product, i.e., 1,3-bis-(acryloyloxyl)-benzene, in a yield of at least about 90 percent by weight.

The aromatic bis-acrylic derivatives of this invention are new compounds per se and are useful as starting material for the production of a variety of high molecular polymers as well as coupling agents because of the presence of two terminal vinyl groups in their molecule. Surprisingly, these compounds have excellent compatibility with linear polyamides, compared with known bis-acrylic derivatives, and exhibit excellent utility as coupling agents for this polymer. For example, a film manufactured by adding a known ethylenically unsaturated compound, e.g., N,N'-methylene-bis-acrylamide or hydoquinone bis-acrylate, in an amount of 10 percent by weight to an alcohol-soluble polyamide permits precipitation of the added compound as crystals on the film surface when stored in a dark place for 2–3 days at room temperature. In contrast, a similar film obtained using an unsaturated compound of this invention represented by the general formula I maintains its transparency for a long period of time and is free almost indefinitely of precipitation of the added compound as crystals on the film surface when stored in a dark place.

In accordance with this invention, therefore, there is provided a photosensitive composition of high sensitivity comprising a mixture of a linear polyamide and an aromatic bis-acrylic derivative represented by the general formula I.

As described above, the present aromatic bis-acrylic derivatives have excellent compatibility with a linear polyamide and can advantageously be added, with variation as to the particular compound and quantity, to the linear polyamide as required by the intended purpose. Considering the fact that ethylenically unsaturated compounds proposed heretofore for admixture with polyamides have been exclusively of aliphatic series, it is quite surprising that present aromatic derivatives are superior in compatibility with such polyamides to such aliphatic compounds. In addition, these aromatic bis-acrylic derivatives possess good solubility in organic solvents and readily dissolve into a variety of solvents used for the polyamide.

As the polyamide utilizable for the photosensitive composition of this invention, there can be mentioned homopolymers of omega-aminocarboxylic acids, condensation polymers of diamino compounds and dicarboxylic acids, and their copolymers. Examples of these include poly-ε-caprolactam, polyhexamethyleneadipamide, N-methoxy-methyl-polyhexamethyleneadipamide, copolymer of ε-caprolactam and hexamethyleneadipamide, terpolymer of ε-caprolactam, hexamethyleneadipamide and hexamethylenesebacamide, terpolymer of ε-caprolactam, hexamethyleneadipamide and dicyclohexylmethanediadipamide, etc.

In the photosensitive composition of this invention, the mixing ratio of the linear polyamide to the aromatic bis-acrylic derivative is usually 100:1 – 1:2, preferably 10:1 – 1:1, by weight.

The photosensitive composition of this invention may contain, in addition to said polyamide and aromatic bis-acrylic derivative, auxiliary substances such as a sensitizing agent capable of further enhancing photosensibility, especially within certain spectral regions, polymerization inhibitors for preventing polymerization during a long-term storage or by heating, etc.

Examples of sensitizing agents are, for example, benzophenone 4,4'-dimethylbenzophenone, 4,4'-dimethoxybenzophenone, 4-chlorobenzophenone, 4,4'-dichlorobenzophenone, benzoin, benzoin methyl ether, anthraquinone, β-methylanthraquinone, β-tert,-butylanthraquinone and acetophenone. The sensitizing agent is advantageously used in a small amount ordinarily within the range of 0.01–20 percent by weight, preferably 0.05–5 percent by weight, based on the total quantity of the polyamide and the compound of the above general formula I.

Mentioned as polymerization inhibitors are, for example, hydroquinone, pyrogallol, methylene blue, phenol and n-butylphenol. The polymerization inhibitor is preferably used in an amount of 0.01–1 percent by weight based on the total quantity of the composition.

The photosensitive composition of this invention can be prepared by homogeneously mixing a linear polyamide with an aromatic bis-acrylic derivative of the general formula I, together, if necessary, with a sensitizer and a polymerization inhibitor. The mixing treatment in this case can be carried out, for example, by milling the components under heat or by dissolving the components into a solvent to form a homogeneous solution and then distilling the solvent from the solution.

When the photosensitive composition of this invention is exposed to actinic light, especially light high in radiation in the ultraviolet region of the spectrum, for example, sunlight and light from xenon lamp, mercury lamp or carbon arc lamp, a reaction is initiated between the unsaturated compound of the general formula I and the polyamide, resulting in certain remarkable changes in properties of the composition, notably, a decrease of solubility or substantial insolubilization.

Taking advantage of its photosensitive character, the compositions of this invention can be utilized as photoresists, resinous planographic printing plates, light-hardenable paints, light-hardenable adhesives, molecular sieves, etc. The composition of this invention can also be used as starting material for manufacturing fibers of elastic property, film and the like shaped articles.

For example, when a layer or film of photosensitive composition of this invention is exposed to light through a transparent negative image original, a stencil or the like and treated with a suitable solvent, such as methanol, the unexposed areas are dissolved off but the exposed areas are retained to leave a positive relief image. The time required for photoreaction in this case will depend on the exact type and amount of the selected aromatic bis-acrylic derivative, sensitizer and polmerization inhibitor, intensity of light, thickness of the desired plate, etc., but will usually occur within the period of from about 30 seconds to 30 minutes.

DESCRIPTION OF PREFERRED EMBODIMENTS

The practice of this invention will be explained in more detail by way of the following examples. It is to be noted, however, that this invention is not limited to the use of the specific compounds and conditions identified in these examples wherein parts and percentages are shown by weight.

EXAMPLE 1

In a 500 ml 4-necked flask equipped with a stirrer, dropping funnel and thermometer are placed 45.9 g (0.507 mol) of acryloyl chloride and 100 ml of dry benzene. The inner temperature is maintained at 5° ± 3°C and then a solution of 22.0 g (0.2. mol) of resorcinol in 100 ml of distilled water and a solution of 75.0 g (0.543 mol) of anhydrous potassium carbonate in 150 ml of distilled water are simultaneously added dropwise over 30 minutes. After completion of the addition, the mixture is stirred for further 30 minutes at the same temperature. The reaction mixture is then allowed to stand to form two separate layers and the benzene layer is taken up in a separating funnel and washed with a diluted aqueous solution of caustic soda to remove unreacted resorcinol and then with water until the pH value of the washing liquid becomes 6–7. The benzene layer is then dried over anhydrous magnesium sulfate and concentrated under reduced pressure to yield 40.0 g (yield: 91.7 percent) of crude 1,3-bis-acryloyloxybenzene. The pure end product is obtained by distilling this crude product in the presence of pyrogallol (polymerization inhibitor) under reduced pressure and collecting a fraction distilled at 125°–126°C/1.8 × $10^{-1}$ mmHg.

| Elementary analysis as $C_{12}H_{10}O_4$: | | |
|---|---|---|
| Calculated: | C 66.10% | H 4.60% |
| Found: | C 65.52% | H 4.55% |

EXAMPLE 2

In a 500 ml 4-necked flask equipped with a stirrer, dropping funnel and thermometer are placed 53.5 g (0.512 mol) of methacryloyl chloride and 100 ml of dry benzene. The inner temperature is maintained at 5° ± 3°C and then a solution of 22.0 g (0.20 mol) of resorcinol in 100 ml of distilled water and a solution of 75.0 g (0.543 mol) of anhydrous potassium carbonate in 150 ml of distilled water are simultaneously added dropwise over 30 minutes. After completion of the addition, the mixture is stirred for further 30 minutes at the same temperature. After the reaction mixture is allowed to stand to form two separate layers, the benzene layer is taken up in a separating funnel and washed with a diluted aqueous solution of caustic soda to remove unreacted resorcinol and then with water until the pH value of the washed liquid becomes 6–7. The benzene layer is dried over anhydrous magnesium sulfate and then concentrated under reduced pressure to yield 45.0 g (yield: 91.4 percent) of crude 1,3-bis-methyacryloyloxybenzene. Purification of this crude product by recrystallization from ethyl ether gives colorless needle crystals having a melting point of 16°–17°C.

| Elementary analysis as $C_{14}H_{14}O_4$: | | |
|---|---|---|
| Calculated: | C 68.28% | H 5.73% |
| Found: | C 66.81% | H 5.64% |

EXAMPLE 3

Into a 3-necked flask provided with a stirrer, dropping funnel and thermometer are charged 11,35 g (0.125 mol) of acryloyl chloride and 100 ml of anhydrous acetone. The inner temperature is maintained at 5°–10°C and then a mixture of 5.5 g (0.05 mol) of m-aminophenol, 13.0 g (0.128 mol) of triethylamine and 50 ml of anhydrous acetone is added dropwise. After completion of the addition, the mixture is stirred for 30 minutes at the same temperature and triethylamine hydrochloride is removed by way of filtration. A transparent light yellow filtrate is concentrated and then water is added to form a precipitate. When the precipitated crystals are filtered and dried, 5.0 g (yield: 46.1 percent) of crude 1-acryloyloxy-3-acryloylaminobenzene are obtained as light brown crystals. Purification of this crude product by recrystallization from water gives white needle crystals having a melting point of 105.0°–105.5°C.

| Elementary analysis as $C_{12}H_{11}NO_3$: | | | |
|---|---|---|---|
| Calculated: | C 65.36% | H 5.07% | N 6.45% |
| Found: | C 66.84% | H 5.02% | N 6.55% |

EXAMPLE 4

To a mixture of 28.6 g of acryloyl chloride and 100 ml of acetone is added dropwise at −15° to −20°C under agitation a solution of 12.3 g of m-phenylenediamine and 27.7 g of triethylamine in 100 ml of acetone. The reaction mixture is agitated for 1 hour at the same temperature and then filtered. The residue is washed with acetone and the filtrate and the washing liquid are combined and concentrated under reduced pressure. Recrystallization of the resulting crude end product from an aqueous ethanol gives 18.2 g (yield: 74.0 percent) of N,N'-bis-acryloyl-m-phenylenediamine having a melting point of 188°C.

| Elementary analysis as $C_{12}H_{12}N_2O_2$: | | | |
|---|---|---|---|
| Calculated: | C 66.65% | H 5.59% | N 12.95% |
| Found: | C 66.74% | H 5.94% | N 12.56% |

EXAMPLE 5

A solution of 10.5 g of m-phenylenediamine and 4.0 g of sodium hydroxide dissolved in 50 percent aqueous methanol is added dropwise at −20°C over 1 hour to a mixture of 23.3 g of methacryloyl chloride and 50 ml of acetone under agitation. The resulting precipitate is filtered and washed with acetone and the filtrate and the washing liquid are combined and concentrated under reduced pressure. Recrystallization of the residue from 20 percent aqueous ethanol gives 10.6 g (yield: 44.3 percent) of N,N'-bis-methacryloyl-m-phenylenediamine having a melting point of 148°C.

| Elementary analysis as $C_{14}H_{16}N_2O_2$: | | | |
|---|---|---|---|
| Calculated: | C 68.83% | H 6.60% | N 11.67% |
| Found: | C 68.79% | H 6.51% | N 11.70% |

EXAMPLE 6

A solution of 6 g of acryloyl chloride dissolved in 20 ml of acetone is added dropwise at −15°C to a solution of 3.22 g of 2,4-tolylenediamine and 6.55 g of triethylamine in 80 ml of acetone under agitation. The resulting precipitate is filtered and washed with acetone. The filtrate and the washing liquid are combined and concentrated under reduced pressure. Recrystallization of the residue from 20 percent aqueous ethanol gives 3.74 g (yield: 55.4 percent) of N,N'-bis-acryloyl-2,4-tolylenediamine having a melting point of 243°C.

| Elementary analysis as $C_{13}H_{14}N_2O_2$: | | | |
|---|---|---|---|
| Calculated: | C 67.81% | H 6.13% | N 12.16% |
| Found: | C 68.10% | H 6.09% | N 12.15% |

EXAMPLE 7

To a solution of 3.1 g of methacryloyl chloride dissolved in 30 ml of acetone is added dropwise with stirring at −25°C a solution of 1.46 g of 2,4-tolylenediamine and 11 g of sodium hydroxide dissolved in a solvent mixture of 10 ml of acetone and 30 ml of methanol. The resulting precipitate is filtered and the residue on the filtrate is washed with acetone. The filtrate and the washing liquid are combined and concentrated under reduced pressure. Recrystallization of the residue from 20 percent aqueous ethanol gives 1.4 g (yield: 45 percent) of N,N'-bis-methacryloyl-2,4-tolylenediamine having a melting point of 146°C.

| Elementary analysis as $C_{13}H_{14}N_2O_2$: | | | |
|---|---|---|---|
| Calculated: | C 69.75% | H 7.02% | N 10.84% |
| Found: | C 69.59% | H 7.02% | N 10.87% |

EXAMPLE 8

One hundred parts of an alcohol-soluble copolymeric polyamide (Ultramid-1*c* manufactured by BASF), 100 parts of 1,3-bis-(acryloyloxy) -benzene and 2 parts of benzophenone are added to 700 ml of methanol. The mixture is stirred at about 50°C until the solid substances are entirely dissolved and then the solution is concentrated under reduced pressure. A significantly viscous liquid thus obtained is spread over a glass plate which has been cleaned and the plate is dried under heating at about 50°C. The resulting sheet is bonded to an aluminum sheet by the aid of an adhesive of phenol resin series and then exposed at a distance of 6 cm from a chemical lamp (Model FL 20 BL, Tokyo Shibaura Denki K.K.) to light fo 15 minutes through a negative image plate. Methanol maintained at 35°C is then sprayed onto the exposed sheet for 5 minutes to effect development whereby a positive image in the form of figure and half tones is formed in conformity with lightened areas of the negative image plate. This apparently shows that the exposed areas become insoluble in methanol.

When an unexposed sheet of the above composition was wrapped with an aluminum foil and stored for 30 days in a cool place, no change was observed in connection with the appearance of surface and transparency. When exposure and development treatments were carried out in a manner as described above using such sheet, a clear positive image was obtained likewise.

EXAMPLE 9

Into 700 parts of methanol are dissolved 100 parts of the same copolymeric polyamide as in Example 8, 30 parts 1-acryloyloxy3-acryloylamino-benzene, 1 part of β-methylanthraquinone and 0.05 part of hydroquinone. A sheet is manufactured from the solution in a manner similar to that described in Example 8. The dry sheet from which methanol has almost completely removed is cut into chips and charged into an injection-molding apparatus where the chips are softened by heating at about 170°C. The composition thus softened is then injection-molded onto a ferrotype plate coated with a silicone resin as peeling promotor. When the plate thus obtained is subjected to exposure and development treatments in a manner as described in Example 8, a clear relief image in obtained on the ferrotype plate.

EXAMPLE 10

Into 800 parts of 90 percent aqueous methanol are dissolved 100 parts of an alcohol-soluble terpolymeric polyamide derived from 40 parts of hexamethyleneadipamide, 30 parts of hexamethylenesebacamide and 40 parts of ϵ-caprolactam; 11 parts of N,N'-diacryloyl-m-phenylenediamine; 3 parts of benzoin; and 0.05 part of hydroquinone. Using this solution, exposure and development treatments are carried out in a manner as described in Example 8, whereby a clear relief image is obtained on the plate.

The same result is obtained when the above treatments are carried out using 12 parts of N,N'-dimethacryloyl-m-phenlenediamine in place of said N,-N'-diacryloyl-m-phenylenediamine.

EXAMPLE 11

To demonstrate the fact that the bridging or coupling agents in the composition of this invention are superior in compatibility with a linear polyamide to known conventional coupling agents, a comparative experiment was performed as follows:

One hundred parts of a copolymeric polyamide (Ultramid-1*c* manufactured by BASF) and 5 parts of benzophenone (sensitizer) were dissolved into 700 parts of methanol. A series of given quantities of the coupling agent was added to portions of the solution, and the mixture in each case was concentrated, spread over a glass plate and dried in hot air at 40°–45°C for 48 hours. Then, transparency of the resulting film having a thickness of about 0.5-1 mm was observed with naked eye. The result is shown in the following table wherein the symbols have the meanings given below:

Z . . . Absence of precipitated crystals, excellent in transparency

X . . . Presence of precipitated crystals, opaque.

TABLE

| | | Compounds | 7 Parts | 10 Parts | 15 Parts | 30 Parts |
|---|---|---|---|---|---|---|
| Coupling Agents According to this Invention | 1 | 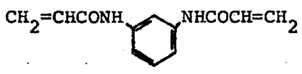 | Z | Z | Z | Z |
| | 2 | 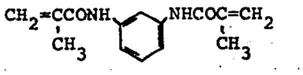 | Z | Z | X | |
| | 3 | 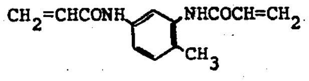 | Z | Z | X | |
| | 4 | 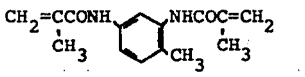 | Z | Z | X | |
| | 5 | 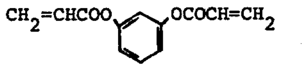 | Z | Z | X | |
| | 6 | 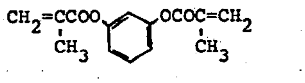 | Z | Z | X | |
| | 7 | 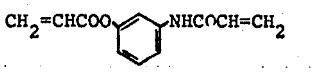 | Z | Z | Z | Z |
| Coupling Agents Outside the Scope of this Invention | 8 | $CH_2$=CHCONHCH$_2$NHCOCH-$CH_2$ | X | | | |
| | 9 |  | X | | | |
| | 10 | 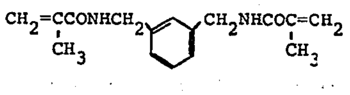 | X | | | |

What is claimed is:

1. A photosensitive polymer composition for insolubilization by exposure to actinic light which consists essentially of a mixture in a molar ratio of about 10:1–1:2 by weight of a solvent-soluble linear polyamide and a meta-phenylene bis-acrylic derivative of the general formula:

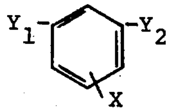

wherein $Y_1$ and $Y_2$ each represent a $$CH_2{=}\underset{R}{C}{-}\underset{O}{\overset{}{C}}{-}O{-}$$

or a $$CH_2{=}\underset{R}{C}{-}\underset{O}{\overset{}{C}}{-}NH{-}$$

group where R and X each stands for a hydrogen atom or a lower alkyl group.

2. A photosensitive composition according to claim 1 wherein said aromatic bis-acrylic derivative has the general formula:

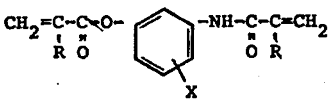

wherein R and X each represent a hydrogen atom or a lower alkyl group.

3. A photosensitive composition according to claim 1 wherein said aromatic bis-acrylic derivative has the general formula:

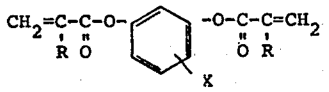

wherein R and X each represent a hydrogen atom or a lower alkyl group.

4. The photosensitive composition of claim 1 containing about 0.01–20 percent of a sensitizing agent and 0.01–1 percent of a polymerization inhibitor, by total weight of the composition.

5. A process for producing an insoluble polymeric composition or the like which comprises the steps of exposing to actinic light a polymeric composition consisting essentially of a mixture in a molar ratio of about 10:1-1:2 by weight of a solvent-soluble linear polyamide and a meta-phenylene bis-acrylic derivative of the general formula:

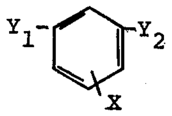

wherein $Y_1$ and $Y_2$ each represent a $$CH_2{=}\underset{R}{C}{-}\underset{O}{\overset{}{C}}{-}O{-}$$

or a $$CH_2{=}\underset{R}{C}{-}\underset{O}{\overset{}{C}}{-}NH{-}$$

group where R and X each stands for a hydrogen atom or a lower alkyl group.

* * * * *

UNITED STATES PATENT OFFICE
CERTIFICATE OF CORRECTION

PATENT NO. : 3,890,150

DATED : June 17, 1975

INVENTOR(S) : Masaki HASEGAWA et al

It is certified that error appears in the above-identified patent and that said Letters Patent are hereby corrected as shown below:

In the Heading of the Patent, under "Assignees", change "Director-General, Agency of Industrial Science & Technology Co. Ltd., Tokyo" to -- Director-General, Agency of Industrial Science and Technology, Tokyo --.

In the Heading of the Patent, under "Foreign Application Priority Data", change "June 3, 1970" in each instance to -- June 4, 1970 --.

Signed and Sealed this

*twenty-eight* Day of *October 1975*

[SEAL]

*Attest:*

RUTH C. MASON
*Attesting Officer*

C. MARSHALL DANN
*Commissioner of Patents and Trademarks*